United States Patent
Nguyen et al.

(10) Patent No.: US 10,840,062 B2
(45) Date of Patent: Nov. 17, 2020

(54) RADIO FREQUENCY FILTER SYSTEM FOR A PROCESSING CHAMBER

(71) Applicant: Applied Materials, Inc., Santa Clara, CA (US)

(72) Inventors: Andrew Nguyen, San Jose, CA (US); Michael G. Chafin, Santa Clara, CA (US); Lu Liu, San Jose, CA (US); Anilkumar Rayaroth, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/601,241

(22) Filed: Oct. 14, 2019

(65) Prior Publication Data

US 2020/0152423 A1 May 14, 2020

Related U.S. Application Data (60) Provisional application No. 62/758,362, filed on Nov. 9, 2018.

(51) Int. Cl.
*H01J 37/32* (2006.01)
*H03H 7/01* (2006.01)
(Continued)

(52) U.S. Cl.
CPC .. *H01J 37/32174* (2013.01); *H01J 37/32724* (2013.01); *H03H 7/0115* (2013.01); *H01L 21/67069* (2013.01); *H01L 21/6833* (2013.01)

(58) Field of Classification Search
CPC .......... H01J 37/32174; H01J 37/32724; H03H 7/0115; H01L 21/67069; H01L 21/6833
See application file for complete search history.

(56) References Cited

U.S. PATENT DOCUMENTS

| 6,136,388 A | 10/2000 | Raoux et al. |
| 7,611,640 B1 | 11/2009 | Howald et al. |

(Continued)

FOREIGN PATENT DOCUMENTS

| KR | 20070118959 A | 12/2007 |
| KR | 20130027935 A | 3/2013 |

OTHER PUBLICATIONS

PCT Notification of Transmittal of the International Search Report and the Written Opinion of the International Searching Authority for International Application No. PCT/US2019/055314; dated Feb. 3, 2020; 9 total pages.

*Primary Examiner* — Raymond R Chai
(74) *Attorney, Agent, or Firm* — Patterson + Sheridan, LLP (57) ABSTRACT

A radio frequency (RF) filter system for a substrate processing chamber comprises a first RF filter coupled to a first element of the processing chamber and a second RF filter coupled to the first element of the processing chamber. Each of the RF filters comprises a first filter stage configured to reject a first frequency, a second filter stage coupled to the first filter stage and configured to reject a second frequency, and a third filter stage coupled to the second filter stage and configured to reject the first frequency. Further, the first filter stage comprises a first inductor and a first capacitance, the second filter stage comprises a second inductor and a second capacitance, the third filter stage comprises a third inductor and a third capacitance.

20 Claims, 7 Drawing Sheets

(51) Int. Cl.
  *H01L 21/683* (2006.01)
  *H01L 21/67* (2006.01)

(56) References Cited

U.S. PATENT DOCUMENTS

| | | |
|---|---|---|
| 8,251,011 B2 | 8/2012 | Yamazawa et al. |
| 9,536,711 B2 | 1/2017 | Dhindsa et al. |
| 2002/0149445 A1 | 10/2002 | Chawla et al. |
| 2003/0205327 A1 | 11/2003 | Howald et al. |
| 2007/0284344 A1* | 12/2007 | Todorov ............ H01J 37/32706 219/121.54 |
| 2008/0136560 A1* | 6/2008 | Bavisi .................. H03H 7/38 333/168 |
| 2008/0197780 A1* | 8/2008 | Yamazawa ........ H01L 21/67098 315/111.21 |
| 2011/0102103 A1* | 5/2011 | Li ....................... H03H 7/1775 333/175 |
| 2011/0241798 A1* | 10/2011 | Hong .................. H03H 7/1791 333/175 |
| 2013/0206337 A1 | 8/2013 | Dhindsa et al. |
| 2017/0033760 A1* | 2/2017 | Leipold ............... H03H 7/0115 |
| 2017/0213734 A9 | 7/2017 | Marakhtanov et al. |
| 2018/0139834 A1 | 5/2018 | Nagashima et al. |
| 2018/0158709 A1 | 6/2018 | Tsuji et al. |
| 2018/0309423 A1 | 10/2018 | Okunishi et al. |
| 2018/0342375 A1* | 11/2018 | Nguyen ............ H01J 37/32091 |
| 2018/0374672 A1 | 12/2018 | Hayashi et al. |
| 2019/0027344 A1 | 1/2019 | Okunishi et al. |
| 2019/0109576 A1* | 4/2019 | Long ..................... G01S 13/00 |
| 2019/0123717 A1* | 4/2019 | Gavryliuk ............ H03H 7/1741 |
| 2019/0295819 A1 | 9/2019 | Okunishi et al. |
| 2019/0348263 A1 | 11/2019 | Okunishi |

* cited by examiner

RADIO FREQUENCY FILTER SYSTEM FOR A PROCESSING CHAMBER

CROSS REFERENCE

This application claims priority to U.S. Provisional Patent Application 62/758,362 filed on Nov. 9, 2018, the disclosure of which is incorporated herein by reference in its entirety.

BACKGROUND

Field

Embodiments described herein generally relate to a filter system for radio frequencies.

Description of the Related Art

In the semiconductor industry, devices are fabricated by a number of manufacturing processes, such as etching and deposition. Some manufacturing processes include generating plasma within a processing chamber. The plasma is generated by driving a radio frequency (RF) signal onto one or more electrodes of the processing chamber. However, during processing, RF leakage may damage one or more elements of the processing chamber. Specifically, the leakage results in RF power being transmitted onto connection lines coupled to the processing chamber. The RF power may result in overheating of the connection lines, leading to a failure of the connection lines. Accordingly, the processing chamber may need to be shut down to replace the connection lines. Further, the RF leakage may trigger an emissions alarm of the processing chamber, causing the processing chamber to shut down. Shutting down the processing chamber takes the processing chamber offline, reducing production yield of the processing chamber and increasing the production cost of the corresponding semiconductor devices.

Therefore, there is a need for an improved RF filter able to mitigate RF leakage in components coupled to processing chambers.

SUMMARY

In one example embodiment, a radio frequency (RF) filter system for a substrate processing chamber comprises a first RF filter configured to be coupled to a first element of the processing chamber and a second RF filter configured to be coupled to the first element of the processing chamber. The first RF filter comprises a first filter stage configured to reject a first frequency, a second filter stage coupled to the first filter stage and configured to reject a second frequency, and a third filter stage coupled to the second filter stage and configured to reject the first frequency. The first filter stage comprises a first inductor and a first capacitance, the second filter stage comprises a second inductor and a second capacitance, the third filter stage comprises a third inductor and a third capacitance. The second RF filter comprises a fourth filter stage configured to reject the first frequency, a fifth filter stage coupled the fourth filter stage and configured to reject the second frequency, and a sixth filter stage coupled to the fifth filter stage and configured to reject the first frequency. The fourth filter stage comprises a fourth inductor and a fourth capacitance, the fifth filter stage comprises a fifth inductor and a fifth capacitance, and the sixth filter stage comprises a sixth inductor and a sixth capacitance.

In one example embodiment, a substrate processing chamber comprises an electrostatic chuck assembly comprises a chuck body comprising an electrode and one or more heating elements, a high voltage power supply, an alternating current (AC) power supply, and an RF filter system. The RF filter system comprises a first RF filter coupled to the electrode and the high voltage power supply, and a second RF filter coupled to a first heating element of the one or more heating elements and the AC power supply. The first RF filter comprises a first filter stage configured to reject a first frequency, a second filter stage coupled to the first filter stage and configured to reject a second frequency, and a third filter stage coupled to the second filter stage and configured to reject the first frequency. The first filter stage comprises a first inductor and a first capacitance, the second filter stage comprises a second inductor and a second capacitance, and the third filter stage comprises a third inductor and a third capacitance. The second RF filter comprises a fourth filter stage configured to reject the first frequency, a fifth filter stage coupled the fourth filter stage and configured to reject the second frequency, and a sixth filter stage coupled to the fifth filter stage and configured to reject the first frequency. The fourth filter stage comprises a fourth inductor and a fourth capacitance, the fifth filter stage comprises a fifth inductor and a fifth capacitance, and the sixth filter stage comprises a sixth inductor and a sixth capacitance.

In one example embodiment, an RF filter comprises a first filter stage configured to reject a first frequency, a second filter stage coupled to the first filter stage and configured to reject a second frequency, and a third filter stage coupled to the second filter stage and configured to reject the first frequency. The first filter stage comprises a first inductor and a first capacitance, the second filter stage comprises a second inductor and a second capacitance, and the third filter stage comprises a third inductor and a third capacitance.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

For clarity, identical reference numerals have been used, where applicable, to designate identical elements that are common between figures. Additionally, elements of one embodiment may be advantageously adapted for utilization in other embodiments described herein.

DETAILED DESCRIPTION

Processing chambers for a substrate include a substrate support on which a substrate is positioned during processing. The substrate support includes an electrostatic chuck including a puck and cooling base. The electrostatic chuck further includes a chucking electrode coupled to a direct current (DC) power source, one or more heating elements coupled to an alternating current (AC) power source, and a radio frequency (RF) electrode coupled to an RF power source. RF leakage from the RF electrode and the RF power source may occur within the connections between the chucking electrode and DC power source and between the heating elements and the AC power source. The RF leakage may result in RF power being generated within connections, causing a failure of the one or more connections and/or a triggering of an emissions alarm. Accordingly, the processing chamber may be shut down. The following descriptions describe improved RF filters that may be coupled between the chucking electrode and the DC power source and between the heating elements and the AC power source. The RF filters mitigate any RF leakage that may occur, reducing down time of the processing chamber.

Figure 1:
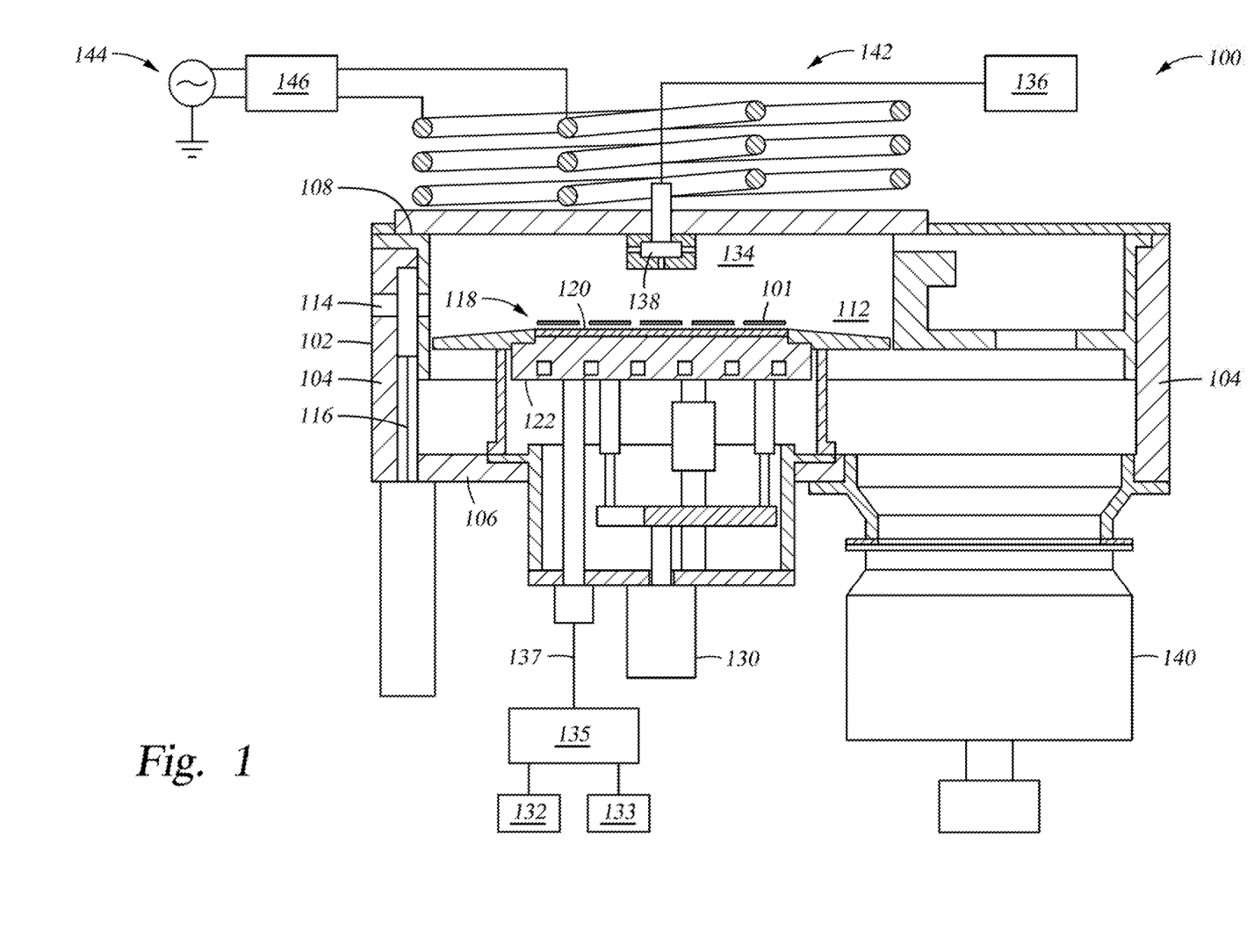
FIG. 1 is a sectional side view illustrating a processing chamber, according to one or more embodiments.

FIG. 1 is a sectional side view illustrating a processing chamber 100. As shown, the processing chamber 100 is an etch chamber, capable of etching a substrate. The processing chamber 100 may be used for various plasma processes. In one embodiment, the processing chamber 100 may be used to perform dry etching with one or more etching agents. For example, the processing chamber may be used for generating a plasma from an etchant, such as $C_xF_y$ (where x and y can be different allowed combinations), $O_2$, $NF_3$, or combinations thereof, which is utilized to etch a material disposed on a substrate. Embodiments of the present disclosure may also be used in etching chromium for photomask applications, etching a profile, such as deep trench and through silicon vias (TSV), in a silicon substrate having oxide and metal layers disposed on the substrate 101, among other applications.

The processing chamber 100 includes a chamber body 102 having sidewalls 104, a bottom 106, and a chamber lid 108. The sidewalls 104, bottom 106, and chamber lid 108 define an interior region 134. The processing chamber 100 further includes a liner 112 disposed in the interior region 134. The liner 112 is configured to prevent the sidewalls 104 from damage and contamination from the processing chemistry and/or processing by-products. In one embodiment, a slit valve door opening 114 is formed through the sidewall 104. The slit valve door opening 114 is configured to allow passage of substrates and substrate transfer mechanism into the interior region 134 of the chamber body 102. A slit valve door 116 selectively opens and closes the slit valve door opening 114.

The processing chamber 100 further includes an electrostatic chuck assembly 118 disposed in the interior region 134. The electrostatic chuck assembly 118 is movably or fixedly positioned in the processing chamber 100. The electrostatic chuck assembly 118 is configured to support a substrate 101 during processing. The electrostatic chuck assembly 118 includes a chuck body 120 and a chuck base 122. The chuck body 120 and chuck base 122 may define a semiconductor processing chamber component assembly. The electrostatic chuck assembly 118 may further include one or more sealing members. The one or more sealing members may be disposed around a bonding material to protect the bonding material from the processing environment.

The chuck body 120 may include one or more through holes (not shown) formed therethrough. The through holes are configured to allow lift pins to pass therethrough to space the substrate 101 from the surface of the electrostatic chuck assembly 118. A lift 130 is configured to raise and lower lift pins relative to the electrostatic chuck assembly 118 during processing and loading/unloading the substrate 101. The electrostatic chuck assembly 118 may be coupled to a power supply 132 for generating chucking force to secure the substrate 101 on the electrostatic chuck assembly. Further, the electrostatic chuck assembly 118 may include one or more heating elements coupled to a power supply 133.

One or more processing gases, such as an etchant, are supplied to an interior region 134 from a gas source 136 via an inlet 138. The processing chamber 100 further includes a vacuum pump 140 in fluid communication with the interior region 134. The vacuum pump 140 is configured to remove by-products and gases from the interior region 134 and maintain a low pressure environment during processing.

The processing chamber 100 further includes an antenna assembly 142 disposed exterior to the chamber lid 108. The antenna assembly 142 is coupled to a RF power source 144 through a matching network 146. During processing, the antenna assembly 142 is energized with RF power provided by the power source 144 to ignite a plasma of processing gases within interior region 134 and to maintain the plasma during processing of the substrate 101. The processing chamber 100 may be energized by the antenna assembly 142 (e.g., an Inductively Coupled Plasma (ICP)) or by a capacitively coupled plasma (CCP). In processing chambers employing CCP, a plasma excitation region is formed between a first electrode (e.g., a showerhead) and a second electrode (e.g., an electrode of the electrostatic chuck assembly 118) of the processing chamber 100. During processing, gas may enter the plasma excitation region through the showerheard and a plasma (e.g., an activated gas) is formed in the plasma excitation region (e.g., the interior region 134) between the showerhead and the electrode of the electrostatic chuck assembly 118. One or more of the showerhead and the electrode of the electrostatic chuck assembly is driven with an RF power supply (e.g., the RF power source 144) to generate the plasma. Alternatively, a remote plasma system (RPS) coupled to the processing chamber 100 may be used to generate an ex-situ plasma and provide the plasma to the plasma excitation region of the processing chamber 100.

Additionally, RF filter system 135 may be coupled between the power supply 132 and the electrostatic chuck assembly 118 and between the power supply 133 and the electrostatic chuck assembly 118. The RF filter system 135 includes one or more RF filters configured to mitigate RF leakage on the connection lines 137 between the power supplies 132 and 133 and the electrostatic chuck assembly 118. For example, the RF filter system 135 may prevent RF leakage within the connection lines 137 when the antenna assembly 142 is energized with RF power to ignite and maintain a plasma within the interior region 134.

Figure 2:
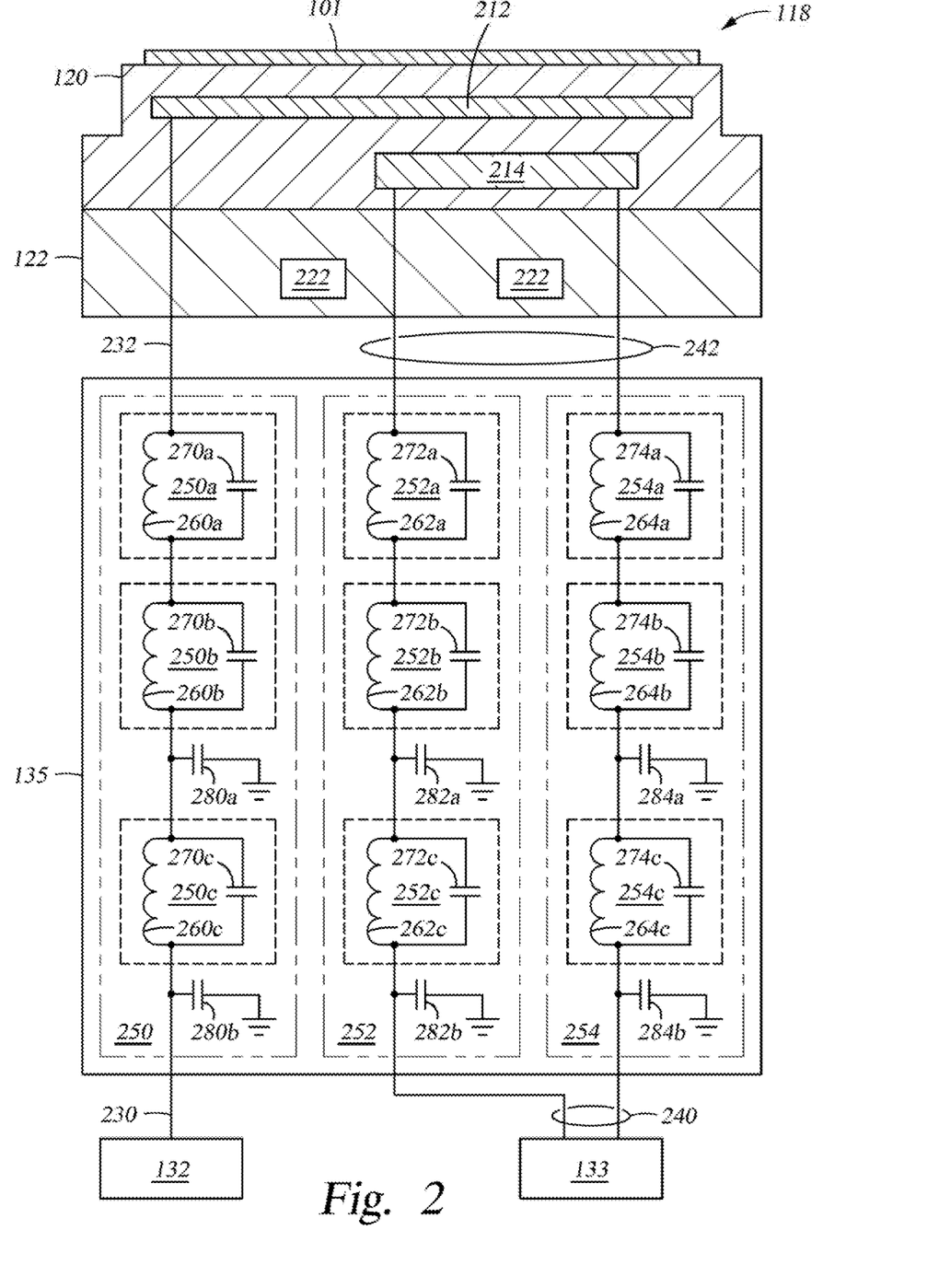
FIGS. 2 and 3 are schematic views of a portion of a processing chamber, according to one or more embodiments.

FIG. 2 illustrates a portion of the electrostatic chuck assembly 118, the power supply 132, the power supply 133, and the RF filter system 135, according to one or more embodiments. As illustrated in FIG. 2, the electrostatic chuck assembly 118 includes a chuck body 120 and a chuck base 122. While not illustrated, the electrostatic chuck assembly 118 may include additional layers. The chuck base 122 is coupled to the chuck body 120 by one or more adhesive layers and includes cooling channels 222 disposed therein that circulate a heat transfer fluid to maintain thermal control of the substrate 101.

The chuck body 120 includes an electrode (or chucking electrode) 212. While a single electrode 212 is illustrated, the chuck body 120 may include two or more electrodes. The electrode 212 is comprised of an electrically conductive material such as copper, graphite, tungsten, molybdenum and the like. When two or more electrodes 212 are included, the electrodes may include a structure such as, but not limited to, a pair of coplanar D-shaped electrodes, coplanar interdigital electrodes, a plurality of coaxial annular electrodes, or circular electrodes, among others. The electrode 212 is coupled to the power supply 132. The power supply 132 may drive the electrode 212 with a positive or negative DC voltage. For example, the power supply 132 may drive the electrode 212 with a voltage in a range of about −5000 volts to about 5000 volts. Alternatively, other negative voltages or other positive DC voltages may be utilized.

The chuck body 120 additionally includes a heating element 214. While a single heating element 214 is shown, the chuck body 120 may include two or more heating elements 214. The heating element 214 may be an electrical heater formed from an electrically conductive material. The heating element 214 is coupled to the power supply 133. The power supply 132 may drive the heating element 214 with an AC voltage signal. For example, the power supply 132 may drive the heating element 214 with an AC voltage signal having an amplitude in a range of about 100V to about 250V. When driven, the heating element 214 is configured to heat a backside of the substrate 101 disposed on the chuck body 120.

The RF filter system 135 is coupled between a power supply and one or more elements (e.g., the electrode 212 and the heating element 214) of the processing chamber 100. For example, the RF filter system 135 is may be coupled between the power supply 132 and the electrode 212. For example, the RF filter system 135 is coupled to the power supply 132 via cable 230 and to the electrode via cable 232. The cable 230 and/or the cable 232 may be high voltage cables. Further, the RF filter system 135 is coupled between the power supply 133 and the heating element 214. For example, the RF filter system 135 is coupled to the power supply 133 via cable 240 and to the heating element 214. The RF filter system 135 is configured to attenuate electromagnetic interference (e.g., mitigate RF leakage) generated in the cable 230 and in the cable 240.

The RF filter system 135 includes multiple RF filters. For example, as illustrated in FIG. 2, the RF filter system 135 includes RF filters 250, 252, and 254. The RF filter 250 is coupled between the power supply 132 and the electrode 212. Further, the RF filters 252 and 254 are disposed between the power supply 133 and the heating element 214.

The RF filters 250, 252, and 254 are multistage RF filters. Further, the RF filters may be referred to as band-stop filters. Each RF filter 250, 252, and 254 comprises three stages. The first stage of each RF filter may be configured to attenuate electromagnetic interference at a first frequency, the second stage of each RF filter may be configured to attenuate electromagnetic interference at a second frequency, and the third stage of each RF filter may be configured to attenuate electromagnetic interference at a third frequency. The first frequency and the third frequency may be the same. For example, the first frequency and the third frequency may be about 60 MHz, and the second frequency may be about 13.56 MHz. Alternatively, the first and third frequencies may be more or less than 60 MHz, and the second frequency may be more or less than 13.56 MHz.

The RF filter 250 includes stages 250a, 250b, and 250c. The RF filter 252 includes stages 252a, 252b, and 252c. Further, the RF filter 254 includes stages 254a, 254b, and 254c. The stage 250a of RF filter 250, the stage 252a of RF filter 252, and the stage 254a of RF filter 254 are configured to attenuate electromagnetic interference having a frequency of about 60 MHz. The stage 250b of RF filter 250, the stage 252b of RF filter 252, and the stage 254b of RF filter 254 are configured to attenuate electromagnetic interference having a frequency of about 13.56 MHz. Further, the stage 250c of RF filter 250, the stage 252c of RF filter 252, and the stage 254c of RF filter 254 are configured to attenuate electromagnetic interference having a frequency of about 60 MHz. Alternatively, while 60 MHz and 13.56 MHz are discussed in the above description, the filter stages may be configured to attenuation electromagnetic interference having frequencies that are greater than or less than 13.56 MHz and/or greater than or less than 60 MHz, respectively.

Each of the filter stages may include an inductance and capacitance (referred to as LC circuits). The inductance may correspond to a discrete inductor. For example, the filter stage 250a includes the inductor 260a, the filter stage 250b includes inductor 260b, and the filter stage 250c includes the inductor 260c. Further, the filter stage 252a includes the inductor 262a, the filter stage 252b includes inductor 262b, and the filter stage 252c includes the inductor 262c. Additionally, the filter stage 254a includes the inductor 264a, the filter stage 254b includes inductor 264b, and the filter stage 254c includes the inductor 264c.

The inductors 260a, 262a, and 264a and the inductors 260c, 262c, and 264c may be formed from a wire wound in a first direction, and the inductors 260b, 262b, and 264b may be formed from a wire wound in a second direction. The first direction may be counter clockwise and the second direction may be clockwise. Alternatively, the first direction may be clockwise and the second direction may be counter clockwise. Further, the number of turns forming the inductors 260a, 262a, and 264a may be greater than or less than the number of turns forming the inductors 260b, 262b, and 264b and/or the number of turns forming the inductors 260c, 262c, and 264c. Additionally, or alternatively, the number of turns forming the inductors 260b, 262b, and 264b is greater than the number of turns forming the inductors 260a, 262a, and 264a and/or the number of turns forming the inductors 260c, 262c, and 264c. Further, the number of turns forming the inductors 260c, 262c, and 264c may be greater than or less than the number of turns of the forming the inductors 260b, 262b, and 264b and/or the number of turns forming the inductors 260b, 262b, and 264b.

The spacing between turns forming the inductors 260a, 262a, and 264a and the inductors 260c, 262c, and 264c may be substantially similar. For example, the spacing may be about 0.1 inches to about 0.4 inches. However, a spacing of less than about 0.1 inches and greater than about 0.4 inches may be utilized. Further the spacing may depend on the inductance of the inductor. For example, decreasing the spacing and increasing the number of turns (windings) increases the inductance of the corresponding inductor. Alternatively, the spacing between turns forming inductors 260a, 262a, and 264a may be larger than or smaller than that of the inductors 260c, 262c, and 264c. The spacing between turns forming inductors the 260a, 262a, and 264a and the inductors 260c, 262c, and 264c may be less than the spacing between turns forming the inductors 260b, 262b, and 264b. For example, the spacing may be about 0.1 inches to about 0.4 inches. However, a spacing of less than about 0.1 inches and greater than about 0.4 inches may be utilized. Further the spacing may depend on the inductance of the inductor. For example, decreasing the spacing and increasing the number of turns (windings) increases the inductance of the corresponding inductor.

The capacitance of each filter stage may correspond to a discrete capacitor or a parasitic capacitance of the inductor.

For example, the filter stage 250a includes capacitance 270a that is a discrete capacitor or a parasitic capacitance of the inductor 260a. The filter stage 250b includes capacitance 270b that is a discrete capacitor or a parasitic capacitance of the inductor 260b. Further, the filter stage 250c includes capacitance 270c that is a discrete capacitor or a parasitic capacitance of the inductor 260c. The filter stage 252a includes capacitance 272a that is a discrete capacitor or a parasitic capacitance of the inductor 262a, and the filter stage 252b includes capacitance 272b that is a discrete capacitor or a parasitic capacitance of the inductor 262b. The filter stage 252c includes capacitance 272c that is a discrete capacitor or a parasitic capacitance of the inductor 262c. Further, the filter stage 254a includes capacitance 274a that is a discrete capacitor or a parasitic capacitance of the inductor 264a, the filter stage 254b includes capacitance 274b that is a discrete capacitor or a parasitic capacitance of the inductor 264b, and the filter stage 254c includes capacitance 274c that is a discrete capacitor or a parasitic capacitance of the inductor 264c. The capacitances 270a, 272a, and 274a may be in a range of about 5 pF to about 50 pF. The capacitances 270b, 272b, and 274b may be in a range of about 10 pF to about 50 pF. Alternatively, the capacitances 270b, 272b, and 274b may be greater than or less than about 10 pF to about 50 pF. The capacitances 270c, 272c, and 274c may be about 5 pF to about 50 pF.

The RF filter 250 additionally includes a capacitor 280a coupled between the filter stage 250b, the filter stage 250c and ground. Further, the RF filter 250 includes a capacitor 280b coupled between the filter stage 250c and ground. The RF filter 252 includes a capacitor 282a coupled between the filter stage 252b, the filter stage 252c and ground. Further, the RF filter 252 includes a capacitor 282b coupled between the filter stage 252c and ground. The RF filter 254 further includes a capacitor 284a coupled between the filter stage 254b, the filter stage 254c and ground. Further, the RF filter 254 includes a capacitor 284b coupled between the filter stage 254c and ground. The capacitance of capacitors 280a, 282a, and 284a and capacitors 280b, 282b, and 284b may be about 0.01 uF. Alternatively, the capacitance of capacitors 280a, 282a, and 284a and capacitors 280b, 282b, and 284b may be greater than about 0.01 uF or less than about 0.01 uF.

Figure 3:
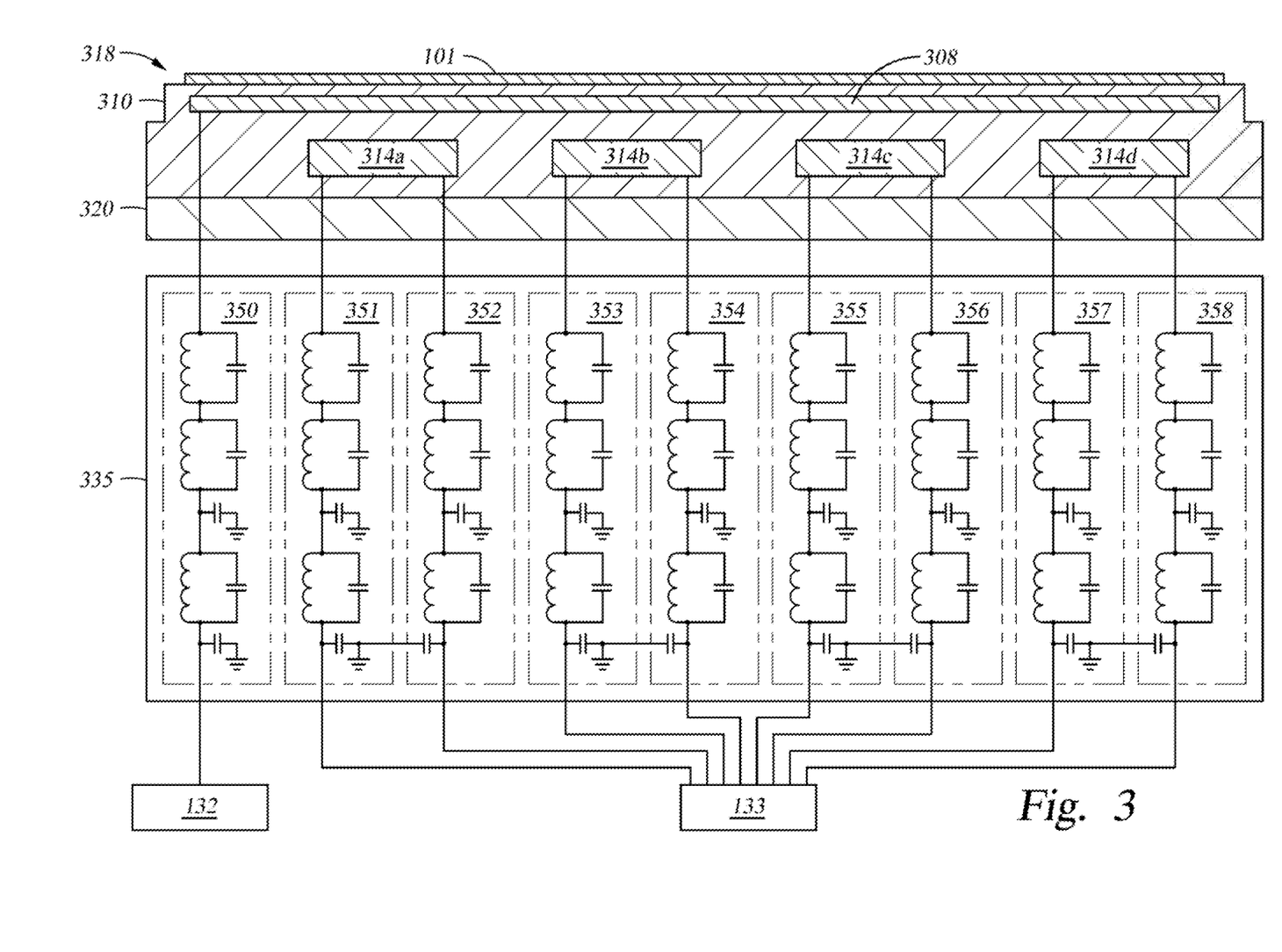

FIG. 3 illustrates electrostatic chuck assembly 318, RF filter system 335, the power supply 132, and the power supply 133, according to one or more embodiments. The electrostatic chuck assembly 318 includes chuck body 310 and chuck base 320. The chuck base 320 is configured similar to that of the chuck base 122 of FIG. 2. Further, the chuck body 310 is configured similar to that of the chuck body 120 of FIG. 2 and includes the electrode 308 and heating elements 314a-314d. The electrode 308 and the heating elements 314a-314d are configured similar to that of the electrode 212 and the heating element 214 of FIG. 2. While, the chuck body 310 is illustrated as including a single electrode 308, alternatively, the chuck body 310 may include two or more electrodes. Further, the chuck body 310 may include more than four heating elements or less than four heating elements.

The RF filter system 335 includes RF filters 350-358. Each of the RF filters 350-358 are configured similar to that of the RF filters 250-254 of FIG. 2. For example, each of the RF filters 350-358 includes a first filter stage, a second stage, and a third filter stage. Each stage comprises a combination of an inductance and capacitance. The stages of each RF filters 351-358 are configured similar to the stages described with regard to FIG. 2. The RF filter 350 is coupled between the electrode 308 and the power supply 132. Additionally, a respective one of the RF filters 351-358 is coupled between the power supply 133 and a respective one of the heating elements 314a-314d.

Figure 4:
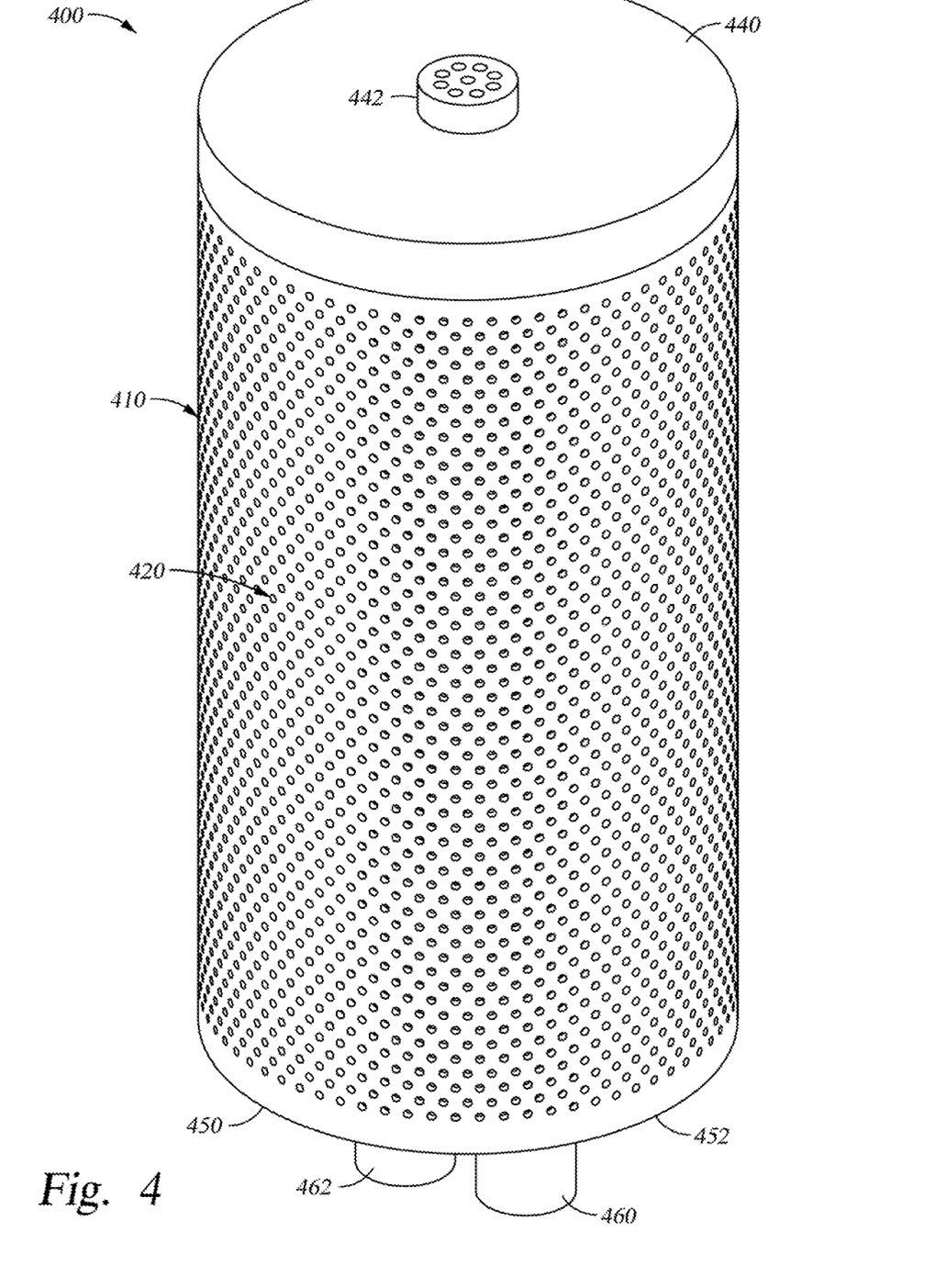
FIGS. 4, 5, 6, and 7 illustrate a container for a radio frequency filter system, according to one or more embodiments.

FIG. 4 illustrates an example container 400 for an RF filter system (e.g., the RF filter system 135 or the RF filter system 335), according to one or more embodiments. The shape of the container 400 may be cylindrical. Alternatively, the container 400 may have a shape other than cylindrical. The container 400 includes a housing 402 having a cover 410 and a lid 440. The cover 410 may include a plurality of perforations 420. The lid 440 may be removed such that the inner portion of the container 400 may be accessed. The lid 440 includes mounting element 442 configured to couple with a processing chamber (e.g., the processing chamber 100). The mounting element 442 may include connections to connect each RF filter of the RF filter system (e.g., the RF filter system 135, 335) with a corresponding electrode (e.g., electrode 212) or heating element (e.g., heating element 214 or 314). Further, the container 400 may include one or more cooling channels 452 located within the base 450. The cooling channels 452 may allow air to flow through the container 400 and cool the RF filters.

The container 400 additionally includes power supply connections 460 and 462. The power supply connections 460 and 462 provide a connection between the power supplies (e.g., the power supplies 132, 133) and the RF filters.

Figure 5:
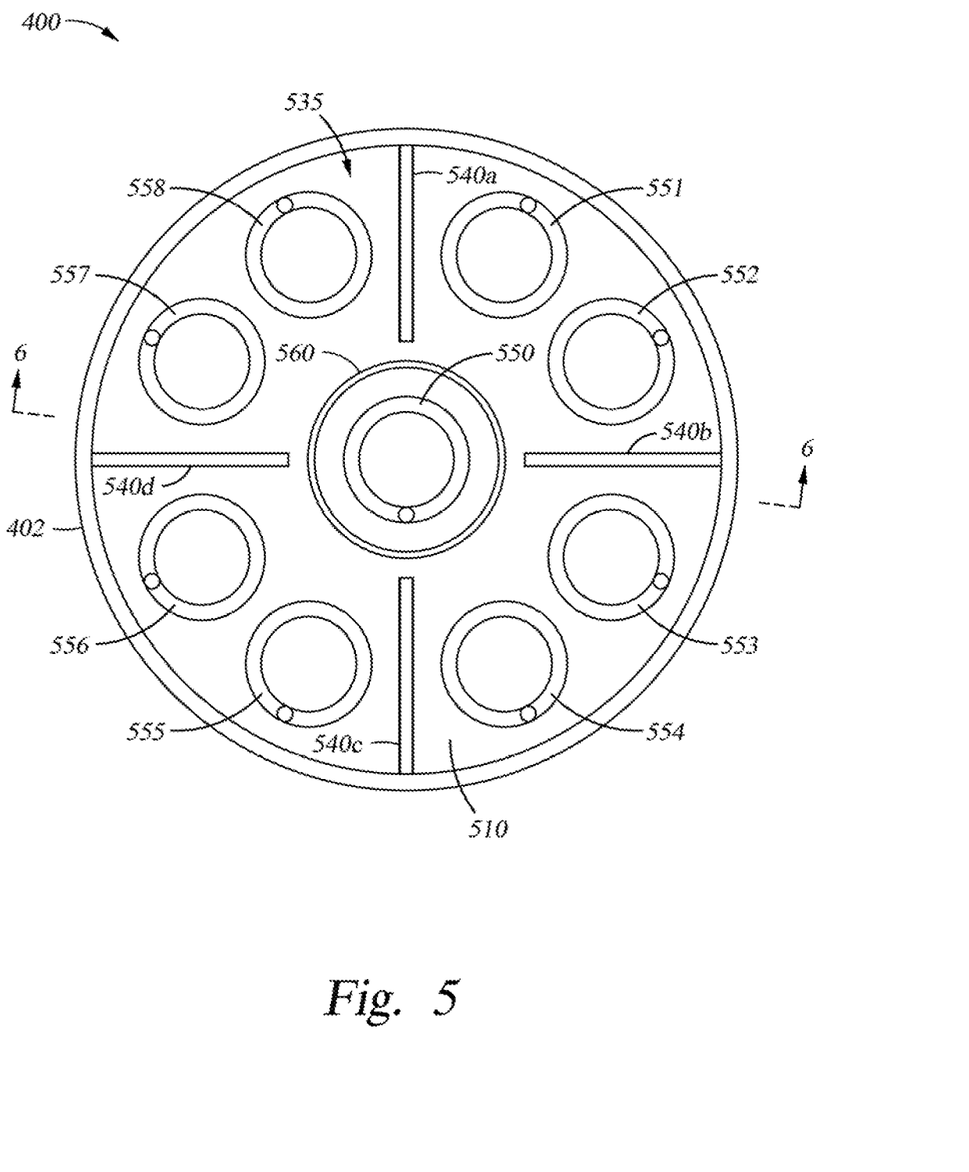

FIG. 5 is a top view of the container 400 with the lid 440 removed and the inner region 510 exposed. As illustrated in FIG. 5, the RF filter system 535 includes RF filters 550-558. The RF filters 550-558 may be configured similar to that of RF filters 250-254 of FIG. 2 and 350-358 of FIG. 3. The container 400 further includes separators 540a-540d and 560. The separators 540a-540d may be coupled to the housing 402. Alternatively, the separators 540a-540d may be independent from the housing 402. Each of the separators 540a-540d is disposed between two of the RF filters 551-558. For example, the separator 540a is disposed between the RF filters 551 and 558, the separator 540b is disposed between the RF filters 552 and 553, the separator 540c is disposed between the RF filters 554 and 555, and the separator 540d is disposed between the RF filters 556 and 557. The separators 540a-5540d act as a shield, shielding corresponding RF filters from each other. For example, the separator 540a may shield the RF filter 551 from the RF filter 558, the separator 540b may shield the RF filter 552 from the RF filter 553, the separator 540c may shield the RF filter 554 from the RF filter 555, and the separator 540d may shield the RF filter 556 from the RF filter 557. The separators 540a-540d may be coupled to a ground voltage or another DC voltage.

The RF filters 551-558 disposed between separators 540 may be coupled to a common element of a processing chamber (e.g., the processing chamber 100). For example, the RF filters 551 and 552 may be coupled to a first heating element (e.g., the heating element 314a) of a processing chamber. Further, the RF filters 551 and 552 may be coupled to the power supply 133. The RF filters 553 and 554 may be coupled to a second heating element (e.g., the heating element 314b) of a processing chamber and to the power supply 133. The RF filters 555 and 556 may be coupled to a third heating element (e.g., the heating element 314c) of a processing chamber and to the power supply 133. The RF filters 557 and 558 may be coupled to a fourth heating element (e.g., the heating element 314d) of a processing chamber and to the power supply 133.

The RF filter 550 may be positioned proximate a center of the container 400. Alternatively, the RF filter 550 may be positioned in another location of the container 400. For example, the RF filter 550 may be positioned where any of the RF filters 551-558 are illustrated as being located. The separator 560 is disposed between the RF filter 550 and the RF filters 551-558. The separator 560 may be driven with a ground voltage or another DC voltage and is configured to shield the RF filter 550 from the other RF filters within the container 400. The RF filter 550 may be coupled to an electrode (e.g., the electrode 212) of a processing chamber (e.g., the processing chamber 100). Additionally, the RF filter 550 may be coupled with the power supply 132 and driven with a DC voltage. Further, the separator 560 may include one or more perforations such that air may flow around and cool the RF filter 550.

The RF filters 551-558 may be disposed such that they form a first ring around the RF filter 550. However, the RF filters 551-558 may be disposed in other configurations. Alternatively, the RF filter system 535 may include additionally RF filters that are disposed in one or more additional rings around the RF filters 551-558. Further, one or more separators may be disposed between the rings of RF filters.

Figure 6:
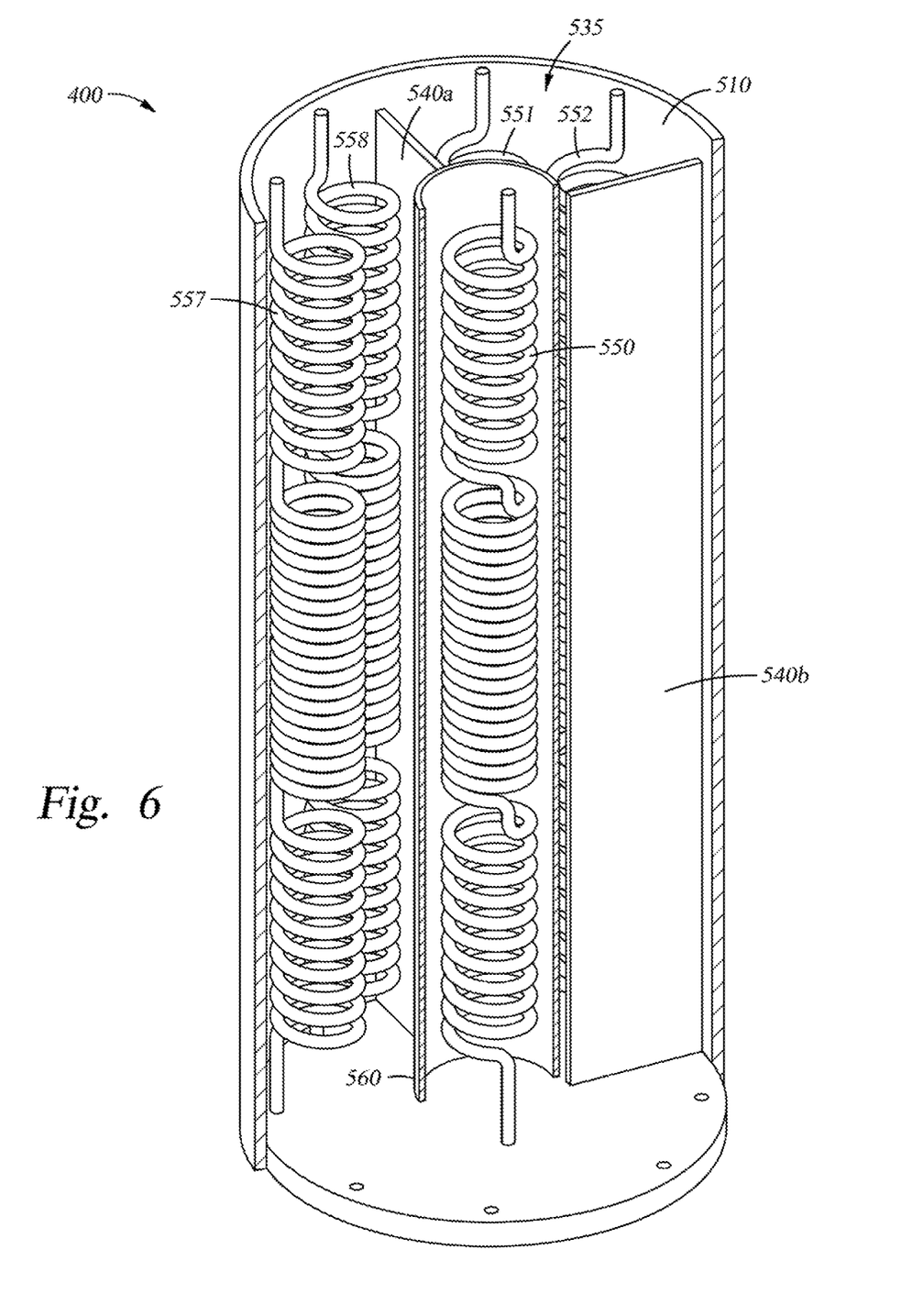

FIG. 6 illustrates a partial cut-away view of the container 400 having a portion of the housing 402 removed exposing the inner region 510, a portion of the RF filter system 535, and separators 540a, 540b. Further, FIG. 6 illustrates a portion of the separator 560 disposed around the RF filter 550.

Figure 7:
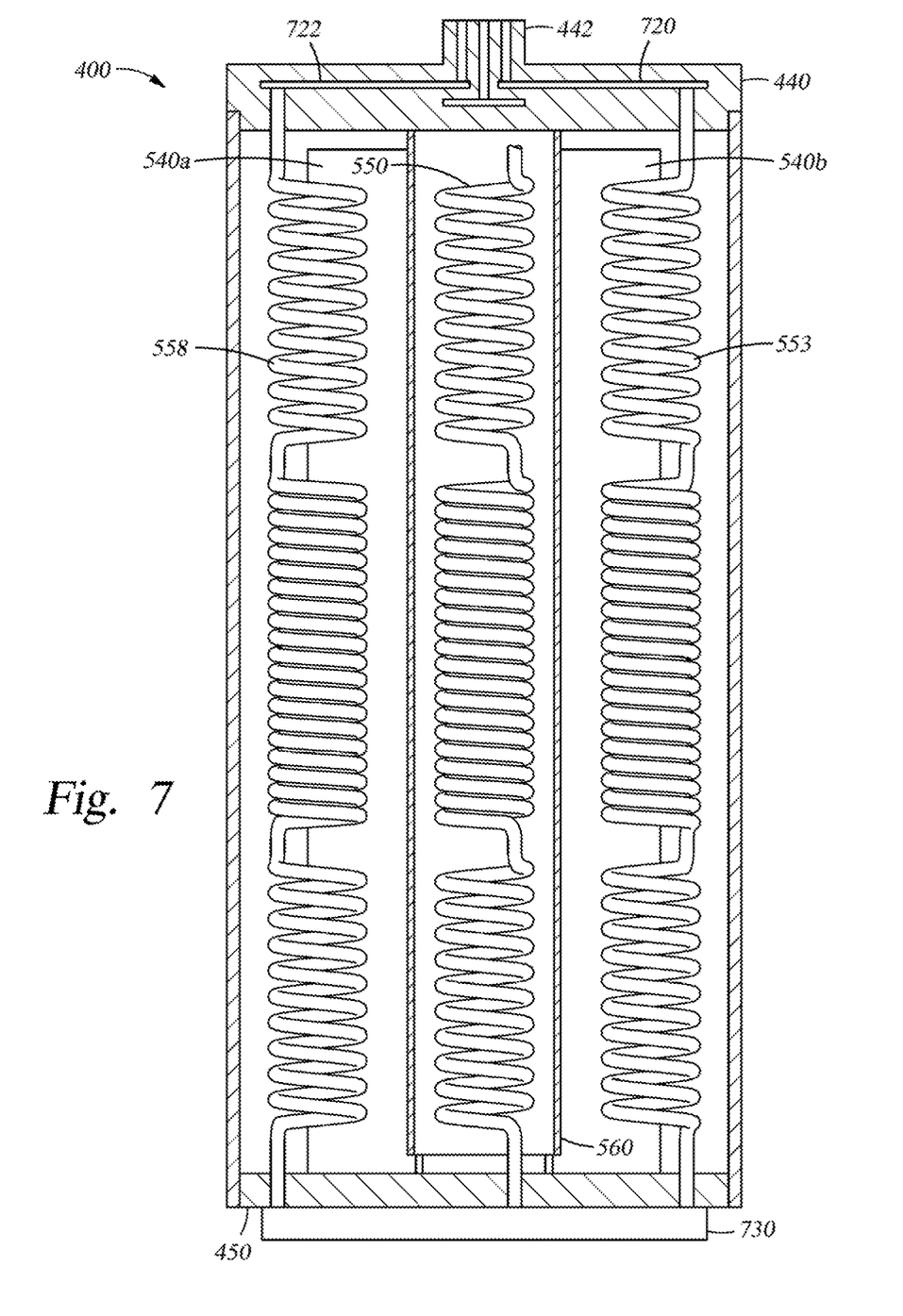

FIG. 7 is a cross-sectional view of the container 400. The RF filters 552 and 557 are coupled to bus lines 720, 722, respectively. Further, each of the RF filters 551, 553-556, and 558 may be coupled to respective bus lines. The bus lines 720, 722 are routed through the mounting element 442 such that the RF filters 551-558 may be connected to a respective heating element of a processing chamber. The bus lines 720, 722 may be disposed on a surface of the lid 440 or within the lid 440. Further, the RF filter 550 may be coupled to routing wires within the mounting element 442 such that the RF filter 550 may be connected to an electrode of an electrostatic chuck assembly.

Each of the RF filters 550-558 may be coupled to a respective power supply via connection element 730. Alternatively, the RF filter 550 may be coupled to a first power supply via a first connection element and the RF filters 551-558 may be coupled to a second power supply via a second connection element.

While FIGS. 4-7 illustrate a container 400 configured to house a plurality of RF filters, alternatively, RF filters coupled to different elements of a processing chamber may be housed in different containers. For example, with reference to FIG. 3, the RF filter 350 may be housed in a first container, the RF filters 351 and 352 may be housed in a second container, the RF filters 353 and 354 may be housed in a third container, the RF filters 355 and 356 may be housed in a fourth container, and the RF filters 357 and 358 may be housed in a fifth container. Alternatively, RF filters coupled to different power supplies may be housed in different containers. For example, the RF filter 350 may be housed in a first container, and one or more of the RF filters 351-358 may be housed in a second container.

While the foregoing is directed to examples of the present disclosure, other and further examples of the disclosure may be devised without departing from the basic scope thereof, and the scope thereof is determined by the claims that follow.

What is claimed is:

1. A radio frequency (RF) filter system for a substrate processing chamber, the RF filter system comprising:
 a first RF filter configured to be coupled to a first element of the substrate processing chamber, the first RF filter comprising:
  a first filter stage configured to reject a first frequency, the first filter stage comprising a first inductor and a first capacitance;
  a second filter stage coupled to the first filter stage and configured to reject a second frequency, the second filter stage comprising a second inductor and a first discrete capacitor having a second capacitance; and
  a third filter stage coupled to the second filter stage and configured to reject the first frequency, the third filter stage comprising a third inductor and a third capacitance, wherein the second filter stage is disposed between the first filter stage and the third filter stage; and
 a second RF filter configured to be coupled to the first element of the substrate processing chamber, the second RF filter comprising:
  a fourth filter stage configured to reject the first frequency, the fourth filter stage comprising a fourth inductor and a fourth capacitance;
  a fifth filter stage coupled the fourth filter stage and configured to reject the second frequency, the fifth filter stage comprising a fifth inductor and a fifth capacitance; and
  a sixth filter stage coupled to the fifth filter stage and configured to reject the first frequency, the sixth filter stage comprising a sixth inductor and a sixth capacitance.

2. The RF filter system of claim 1, wherein the first frequency that the first filter stage is configured to reject is greater than the second frequency that the second filter stage is configured to reject.

3. The RF filter system of claim 2, wherein the first frequency is about 60 MHz and the second frequency is about 13.56 MHz.

4. The RF filter system of claim 1, wherein the first capacitance is a parasitic capacitance of the first inductor, the third capacitance is a parasitic capacitance of the third inductor, the fourth capacitance is a parasitic capacitance of the fourth inductor, and the sixth capacitance is a parasitic capacitance of the sixth inductor.

5. The RF filter system of claim 4, wherein a second discrete capacitor provides the fifth capacitance.

6. The RF filter system of claim 1, wherein an inductance of the first inductor and an inductance of the third inductor are less than an inductance of the second inductor, and an inductance of the fourth inductor and an inductance of the sixth inductor are less than an inductance of the fifth inductor.

7. The RF filter system of claim 1, wherein the first RF filter and the second RF filter are further configured to be coupled to an alternating current power supply.

8. The RF filter system of claim 7 further comprising:
 a third RF filter comprising:
  a seventh filter stage configured to reject the first frequency, the seventh filter stage comprising a seventh inductor and a seventh capacitance;
  an eighth filter stage coupled the fourth filter stage and configured to reject the second frequency, the eighth filter stage comprising an eighth inductor and an eighth capacitance; and
  a ninth filter stage coupled to the fifth filter stage and configured to reject the first frequency, the ninth filter stage comprising a ninth inductor and a ninth capacitance, wherein the third RF filter is coupled to be coupled to a high voltage power supply and to a second element of the substrate processing chamber.

9. A substrate processing chamber, comprising:
an electrostatic chuck assembly comprising:
a chuck body comprising an electrode and one or more heating elements;
a high voltage power supply;
an alternating current (AC) power supply; and
a radio frequency (RF) filter system comprising:
a first RF filter coupled to the electrode and the high voltage power supply, the first RF filter comprising:
a first filter stage configured to reject a first frequency, the first filter stage comprising a first inductor and a first capacitance;
a second filter stage coupled to the first filter stage and configured to reject a second frequency, the second filter stage comprising a second inductor and a first discrete capacitor having a second capacitance; and
a third filter stage coupled to the second filter stage and configured to reject the first frequency, the third filter stage comprising a third inductor and a third capacitance, wherein the second filter stage is disposed between the first filter stage and the third filter stage; and
a second RF filter coupled to a first heating element of the one or more heating elements and the AC power supply, the second RF filter comprising:
a fourth filter stage configured to reject the first frequency, the fourth filter stage comprising a fourth inductor and a fourth capacitance;
a fifth filter stage coupled the fourth filter stage and configured to reject the second frequency, the fifth filter stage comprising a fifth inductor and a fifth capacitance; and
a sixth filter stage coupled to the fifth filter stage and configured to reject the first frequency, the sixth filter stage comprising a sixth inductor and a sixth capacitance.

10. The substrate processing chamber of claim 9, wherein the first frequency that the first filter stage is configured to reject is greater than the second frequency that the second filter stage is configured to reject.

11. The substrate processing chamber of claim 10, wherein the first frequency is about 60 MHz and the second frequency is about 13.56 MHz.

12. The substrate processing chamber of claim 9, wherein the first capacitance is a parasitic capacitance of the first inductor, the third capacitance is a parasitic capacitance of the third inductor, the fourth capacitance is a parasitic capacitance of the fourth inductor, and the sixth capacitance is a parasitic capacitance of the sixth inductor.

13. The substrate processing chamber of claim 12, wherein a second discrete capacitor provides the fifth capacitance.

14. The substrate processing chamber of claim 9, wherein an inductance of the first inductor and an inductance of the third inductor are less than an inductance of the second inductor, and an inductance of the fourth inductor and an inductance of the sixth inductor are less than an inductance of the fifth inductor.

15. The substrate processing chamber of claim 9, wherein the RF filter system further comprises:
a third RF filter comprising:
a seventh filter stage configured to reject the first frequency, the seventh filter stage comprising a seventh inductor and a seventh capacitance;
an eighth filter stage coupled the fourth filter stage and configured to reject the second frequency, the eighth filter stage comprising an eighth inductor and an eighth capacitance; and
a ninth filter stage coupled to the fifth filter stage and configured to reject the first frequency, the ninth filter stage comprising a ninth inductor and a ninth capacitance, wherein the third RF filter is coupled to be coupled to the AC voltage power supply and to the first heating element.

16. The substrate processing chamber of claim 9 further comprising a container, and wherein the RF filter system is housed within the container.

17. A radio frequency (RF) filter, comprising:
a first filter stage configured to reject a first frequency, the first filter stage comprising a first inductor and a first capacitance;
a second filter stage coupled to the first filter stage and configured to reject a second frequency, the second filter stage comprising a second inductor and a first discrete capacitor having a second capacitance; and
a third filter stage coupled to the second filter stage and configured to reject the first frequency, the third filter stage comprising a third inductor and a third capacitance, wherein the second filter stage is disposed between the first filter stage and the third filter stage.

18. The RF filter of claim 17, wherein the first frequency that the first filter stage is configured to reject is greater than the second frequency that the second filter stage is configured to reject.

19. The RF filter of claim 18, wherein the first capacitance is a parasitic capacitance of the first inductor and the third capacitance is a parasitic capacitance of the third inductor.

20. The RF filter of claim 17, wherein an inductance of the first inductor and an inductance of the third inductor are less than an inductance of the second inductor.

* * * * *